(12) United States Patent
Chong et al.

(10) Patent No.: US 8,788,886 B2
(45) Date of Patent: Jul. 22, 2014

(54) VERIFICATION OF SOC SCAN DUMP AND MEMORY DUMP OPERATIONS

(75) Inventors: Andrew K. Chong, Cupertino, CA (US); Heon Cheol "Paul" Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 356 days.

(21) Appl. No.: 13/222,470

(22) Filed: Aug. 31, 2011

(65) Prior Publication Data
US 2013/0055023 A1 Feb. 28, 2013

(51) Int. Cl.
*G06F 11/00* (2006.01)
(52) U.S. Cl.
USPC .......................... 714/38.11; 714/28
(58) Field of Classification Search
USPC ................... 714/38.11, 45, 28, 29
See application file for complete search history.

(56) References Cited

U.S. PATENT DOCUMENTS

| | | | |
|---|---|---|---|
| 4,590,552 A | 5/1986 | Guttag et al. | |
| 5,517,432 A * | 5/1996 | Chandra et al. ............... | 703/14 |
| 5,943,489 A * | 8/1999 | Shiratori ..................... | 703/16 |
| 5,970,241 A | 10/1999 | Deao et al. | |
| 6,018,815 A | 1/2000 | Baeg | |
| 6,311,292 B1 | 10/2001 | Choquette et al. | |
| 6,314,539 B1 | 11/2001 | Jacobson et al. | |
| 6,370,660 B1 | 4/2002 | Mann | |
| 6,380,724 B1 | 4/2002 | Mahurin et al. | |
| 6,408,414 B1 | 6/2002 | Hatada | |
| 6,587,981 B1 | 7/2003 | Muradali et al. | |
| 6,615,380 B1 | 9/2003 | Kapur et al. | |
| 6,711,708 B1 | 3/2004 | Shimomura | |
| 6,745,356 B1 | 6/2004 | Wong | |
| 6,754,763 B2 | 6/2004 | Lin | |
| 6,757,856 B2 | 6/2004 | Bassett | |
| 6,766,501 B1 | 7/2004 | Duggirala et al. | |
| 6,839,654 B2 | 1/2005 | Rollig et al. | |
| 6,876,941 B2 | 4/2005 | Nightingale | |
| 6,941,504 B2 | 9/2005 | Berry, Jr. et al. | |

(Continued)

FOREIGN PATENT DOCUMENTS

| | | |
|---|---|---|
| EP | 0869434 | 10/1998 |
| JP | 2002-122637 | 4/2002 |

OTHER PUBLICATIONS

European Search Report in Application No. 11192311.6 dated Mar. 23, 2012, 13 pages.

(Continued)

*Primary Examiner* — Philip Guyton
(74) *Attorney, Agent, or Firm* — Rory D. Rankin; Meyertons, Hood, Kivlin, Kowert & Goetzel, P.C.

(57) ABSTRACT

Techniques are disclosed for verifying memory dump operations and scan dump operations. A memory specification is analyzed and parsed to generate a script for performing a memory dump operation. To verify the memory dump operation, first, a set of values are written to one or more memories of a SoC. Next, the script is executed to perform the memory dump operation, and then an output bitstream from the operation is compared to the set of values. The scan dump operation involves taking a snapshot of a model of a SoC in an emulator. A scan dump operation is performed, and an output bitstream from the operation is compared to the snapshot. The memory and scan dump operations are invoked using commands in a first language, and the commands are translated into a second language to perform the operations.

21 Claims, 12 Drawing Sheets

(56) References Cited

U.S. PATENT DOCUMENTS

| | | | |
|---|---|---|---|
| 6,996,747 B2 | 2/2006 | Swoboda et al. | |
| 7,069,486 B2 | 6/2006 | Nagamine et al. | |
| 7,085,980 B2 | 8/2006 | Martin-de-Nicolas et al. | |
| 7,340,658 B2 | 3/2008 | Seuring | |
| 7,437,692 B2 * | 10/2008 | Oberlaender | 716/138 |
| 7,487,367 B2 | 2/2009 | Belnet et al. | |
| 7,493,247 B2 | 2/2009 | Memmi | |
| 7,533,315 B2 | 5/2009 | Han et al. | |
| 7,930,604 B1 | 4/2011 | Azimi et al. | |
| 8,136,003 B2 | 3/2012 | Swoboda | |
| 8,433,953 B1 * | 4/2013 | Gaudette et al. | 714/33 |
| 2002/0133794 A1 | 9/2002 | Kanapathippillai et al. | |
| 2002/0184561 A1 | 12/2002 | Tagawa et al. | |
| 2003/0025490 A1 | 2/2003 | Chen | |
| 2004/0088659 A1 | 5/2004 | Mori | |
| 2004/0098643 A1 | 5/2004 | Schulz | |
| 2004/0181722 A1 * | 9/2004 | Lee et al. | 714/726 |
| 2005/0193254 A1 | 9/2005 | Yee | |
| 2006/0069953 A1 | 3/2006 | Lippett et al. | |
| 2006/0136785 A1 * | 6/2006 | Shu et al. | 714/38 |
| 2006/0156070 A1 | 7/2006 | Swoboda | |
| 2007/0214389 A1 | 9/2007 | Severson et al. | |
| 2007/0226702 A1 | 9/2007 | Segger | |
| 2008/0072100 A1 * | 3/2008 | Okada | 714/28 |
| 2009/0006808 A1 | 1/2009 | Blumrich et al. | |
| 2009/0282304 A1 | 11/2009 | Piry et al. | |

OTHER PUBLICATIONS

Mark Bohr, "The New Era of Scaling in an SoC World," Digest of Technical Papers, ISSCC 2009, Feb. 9, 2009, XP831742153, pp. 23-29.

"Setup the Debugger for a CoreSight System," Aug. 11, 2010, 27 pages.

International Search Report and Written Opinion in Application No. PCT/US2011/063311 mailed Mar. 29, 2012, 10 pages.

Fritsch, et al., "Speeding Up Simulation by Emulation-A Case Study," Design, Automation and Test in Europe Conference Date '99, Munich, Germany, Mar. 9-12, 1999, pp. 127-134.

* cited by examiner

```
SHIR SWITCH_DEBUG_CLK_TO_XI0
SHIR STOP_CLK
SHIR FORCE_PWR_ON
SHIR SEL_PARTITION
SHDR 61 0x00000000 0x00010000
SHIR J1500I
SHDR 55 0x280000 0x00006000
SHIR MEM_DUMP
== Iteration starts here
== loop for ADDR : 0
MSIR MEM_DUMP_CLKEN MBIST_RESET
SHDR 6 0x08
MSIR MEM_DUMP MBIST_RESET
SHDR 6 0x09
MSIR MEM_DUMP MBIST_INST1
SHDR 8 0x24
MSIR MEM_DUMP MBIST_INST2
SHDR 16 0x25F2
MSIR MEM_DUMP MBIST_INST3
SHDR 86 0x082224 0x02400000 0x01FFFFFE
MSIR MEM_DUMP MBIST_INST2
SHDR 16 0x21F2
MSIR MEM_DUMP MBIST_INST3
SHDR 100 0x2 0x0000F000 0x00000000 0x00000000
MSIR MEM_DUMP MBIST_INST2
SHDR 16 0x27F2
MSIR MEM_DUMP MBIST_ON
SHDR 6 0x09
IDLE 1
MSIR MEM_DUMP MBIST_RESULT
              *
              *
              *
```

*Script 54A*

FIG. 5

```
INIT
SHIR STOP_CLK
WAIT
SHIR SEL_PARTITION
SHDR 51 0x00000 0x02000000
SHIR J1500I
SHDR 48 0x8000 0x00000000
SHIR SEL_PARTITION
SHDR 51 0x00000 0x00000020
SHIR J1500I
SHDR 48 0x8004 0x00058010
SHDR 48 0x8004 0x00058010
SHIR SCAN_DUMP
SHDM 140192 1
```

Scan Dump
Operation Script
70

*FIG. 7*

VERIFICATION OF SOC SCAN DUMP AND MEMORY DUMP OPERATIONS

BACKGROUND

1. Field of the Invention

The present invention relates generally to design verification, and in particular to verification techniques for debugging systems on chips.

2. Description of the Related Art

Memory dump and scan dump operations are two common operations that may be performed on a fabricated SoC on a development board. These operations are useful during a debugging stage for determining the cause of a SoC malfunction. The memory dump operation may involve reading out all of the memory values of a SoC, and the scan dump operation may involve reading out all of the flip-flop values of a SoC. If a SoC dies unexpectedly or displays some unexpected behavior, the clocks to the SoC may be turned off, and then a scan dump or memory dump operation may be performed.

A SoC may include a series of registers, with each register corresponding to a latch or flip-flop. In a scan dump operation, the contents of each register are shifted to an output scan pin in a concatenated sequence. The sequence of registers in combination with an input scan-in pin and an output scan-out pin may be referred to as a scan chain. In a typical SoC test, a circuit may be stimulated for a specified number of clock cycles and stopped. The contents of each register may then be shifted to an output scan pin. The scan dump operation allows all or a portion of the register or flip-flop values to be observed to help determine the cause of the unexpected behavior. Similarly, a memory dump operation reads out all or a portion of the memory values of the different memories of the SoC. These memory values can be analyzed to help determine the cause of the unexpected behavior.

While the scan dump and memory dump operations are useful for helping in debugging a SoC, before they can be used, these operations are typically verified to make sure they function properly. However, a traditional verification method, such as simulation, is a time-consuming and inefficient method for verifying the scan dump and memory dump operations.

SUMMARY

In one embodiment, a design verification system may perform and verify various SoC debug operations. The design verification system may include a host computer, a debugger, and a design under test (DUT). In various embodiments, the DUT may be a SoC model in an emulator, a SoC on a development board, or another device or model. The host computer may be coupled to the debugger, and the debugger may be coupled to the DUT.

In one embodiment, a memory specification may be analyzed and parsed to generate one or more scripts for performing a memory dump operation. A top-level script may also be generated, and the top-level script may include commands to call the one or more scripts generated from the memory specification. Then, a memory dump operation may be performed by invoking the top-level script and a bitstream may be output from the plurality of memories.

In one embodiment, a memory dump operation may be verified by the design verification system. The debugger may be configured to write a set of values to a plurality of memories in the DUT. Then, a memory dump operation may be performed. To verify the memory dump operation, the bitstream output from the operation may be compared to the set of values to determine equality or inequality.

In another embodiment, a scan dump operation may be verified by the design verification system. The design verification system may include a SoC model in an emulator and a simulation computer coupled to the emulator. The simulation computer may take a snapshot of a plurality of flip-flops within the SoC model. A scan dump operation may be performed and a bitstream read out from the plurality of flip-flops of the SoC model. The bitstream may be compared to the snapshot to verify the accuracy of the scan dump operation.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which:

FIG. 5 is one embodiment of a script file for performing a memory dump operation.

FIG. 7 is a scan dump operation script in accordance with one or more embodiments.

DETAILED DESCRIPTION OF EMBODIMENTS

Figure 1:
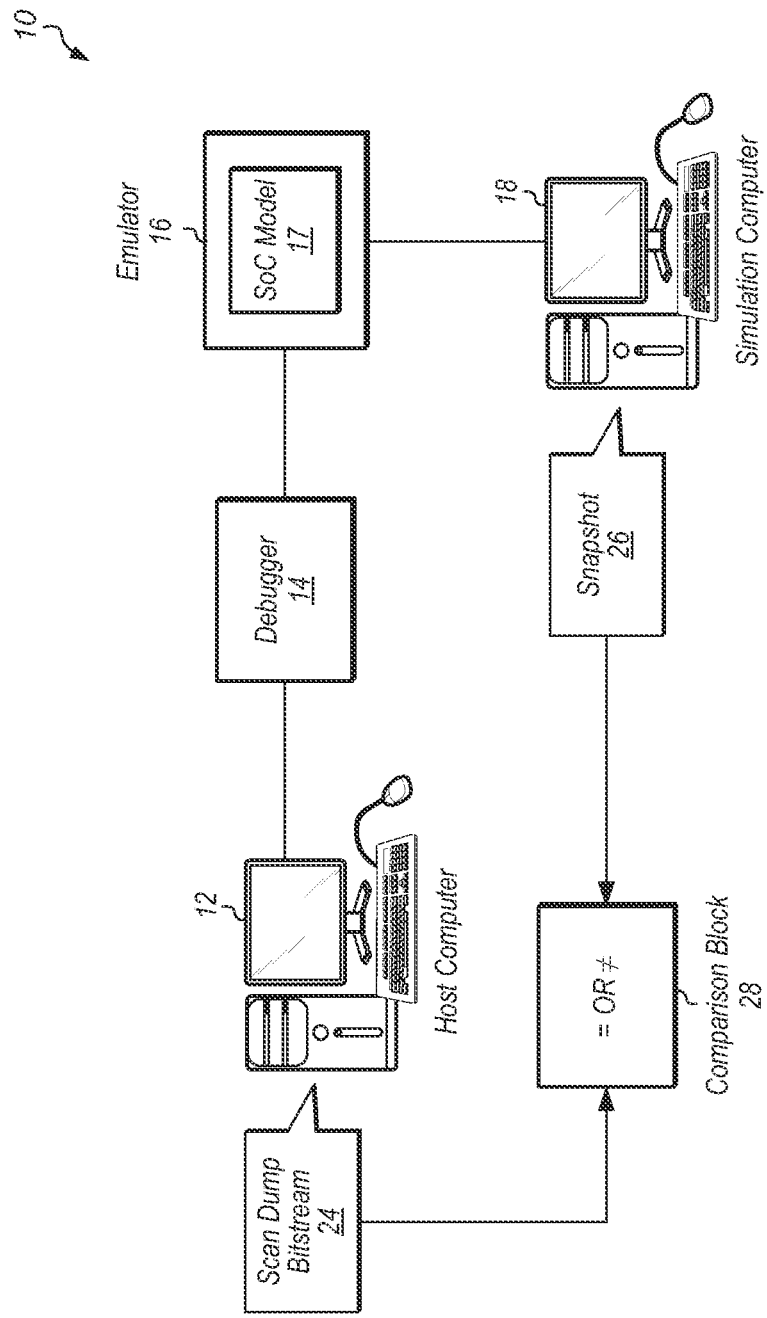
FIG. 1 is a block diagram illustrating one embodiment of a design verification system.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A processor comprising a cache . . . ." Such a claim does not foreclose the processor from including additional components (e.g., a network interface, a crossbar).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., a field programmable gate array (FPGA) or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a SoC having five processor cores, the terms "first" and "second" cores can be used to refer to any two of the five cores.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a block diagram illustrating one embodiment of a design verification system 10 is shown. In the illustrated embodiment, design verification system 10 includes a host computer 12, debugger 14, emulator 16, and simulation computer 18. It is noted that design verification system 10 may also include many other components and connections not shown in FIG. 1.

Host computer 12 may be utilized by a software developer or other user to enter commands or input scripts. The commands and/or scripts may be configured to test a software model of a SoC executing in emulator 16. In various embodiments, host computer 12 may display a command line in a tool command language (TCL) console to a software developer. In one embodiment, host computer 12 may be any type of personal computer, laptop, server, or workstation, such as an Apple® Macintosh® computer or the like. In other embodiments, host computer 12 may be any type of computing device such as a smartphone, tablet, or the like. Host computer 12 may also be referred to as a user terminal.

A language with high-level commands may be utilized to perform specific operations in design verification system 10, and the high-level commands may be translated into JTAG commands at debugger 14. In one embodiment, the high-level language may be referred to as JTAG state microcode (JSM). JSM may be a language that standardizes the entire debug verification environment. JSM introduces a new layer of abstraction on top of the JTAG protocol. JSM may include a specific syntax and semantics. The syntax may include the spelling, grammar, and/or format of the JSM language. The semantics may include the instructions and commands used in the JSM language.

Host computer 12 may store any number of scripts or files of commands and these scripts and files may be executed on debugger 14. In various embodiments, individual JSM commands may be entered on the command line and executed one at a time. In one embodiment, a plurality of JSM commands may be stored in a JSM file and then put into a directory on host computer 12 named "JSM". In various embodiments, host computer 12 may store files written in any scripting language, such as Tool Command Language (TCL), Practical Extraction and Report Language (PERL), Python, Expect, Bourne Shell, and C Shell.

The scripts may contain a plurality of JSM commands, and each script may be designed to perform a particular function or task. For example, a memory dump operation may be performed by invoking a script. In one embodiment, there may be thousands of JSM files called by the script to perform the memory dump operation. There may be a plurality of different types of memories within SoC model 17, and there may be a separate JSM file for each type of memory. To perform the memory dump operation, there may be a main script file that calls each of the individual JSM files corresponding to each of the separate memory types. Each of the individual JSM files may be executed to read out the data from each memory type within SoC model 17. In one embodiment, the memory dump operation may not be order dependent, allowing the corresponding JSM files to be executed in any order.

Host computer 12 may be connected to debugger 14, and host computer 12 may transfer scripts to debugger 14. In one embodiment, host computer 12 may be connected to debugger 14 via an Ethernet interface. In another embodiment, host computer 12 may be connected to debugger 14 via the internet. In further embodiments, host computer 12 may be coupled to debugger 14 via various other types of connections and interfaces. In still further embodiments, multiple host computers 12 may connect to debugger 14 to perform tests. The multiple host computers 12 may be connected to debugger 14 via a hub, network switch, or other interface/device.

Host computer 12 may convey JSM commands to debugger 14. In response, debugger 14 may execute commands to perform various debug operations, including reading and writing to registers and other memory values within one or more SoC models (e.g., SoC model 17) in emulator 16. Debugger 14 may also be referred to as a debug controller. In one embodiment, debugger 14 may include a translator which may convert the JSM commands into JTAG commands. Debugger 14 may then convey the JTAG commands to emulator 16. Specifically, debugger 14 may generate a bitstream that is conveyed to a test access port (TAP) controller of the model of the SoC in emulator 16. The bitstream may be used to setup and initialize various types of debug and test functions in the model. For example, the bitstream may be used to implement a scan dump operation, a memory dump operation, and/or other test and debug operations. In one embodiment, the bitstream may be generated to shift 32-bit values into various registers within the model of the SoC. For example, to perform a scan dump operation, a first register within the model may be set to a first value, a second register may be set to a second value, and so on.

In one embodiment, debugger 14 may have an internet protocol (IP) address, and host computer 12 may access debugger 14 by addressing its IP address. In one embodiment, debugger 14 may generate a TCL console and debugger 14 may provide a command prompt within the TCL console to host computer 12 when host computer 12 connects and logs in to debugger 14. The TCL console may have a built-in library of commands for a user to access and use for controlling emulator 16. The TCL console may allow users to enter commands on the host computer 12 for execution on debugger 14.

Debugger 14 may be configured to source a translator software application from host computer 12. Debugger 14 may also be configured to translate a first group of commands (i.e., a script) from a first language into a second group of commands in a second language, and debugger 14 may then be configured to transmit the second group of commands as a bitstream to SoC model 17 in emulator 16. The bitstream may cause SoC model 17 to run one or more tests and/or perform one or more operations. In one embodiment, the interface between debugger 14 and emulator 16 may be a JTAG interface. In other embodiments, the interface between debugger 14 and emulator 16 may be any of various other types of interfaces, such as a serial (via a UART) or a parallel interface, or the like. In another embodiment, an I/O board (not shown) may be utilized to couple commands, data, and/or signals between debugger 14 and emulator 16.

In one embodiment, emulator 16 may include one or more software models of SoCs, such as SoC model 17, and/or other hardware components. In various embodiments, the software models may be designed in a hardware description language (HDL) (e.g., Verilog, very high speed integrated circuits hardware description language (VHDL)). Prior to being implemented within emulator 16, the models may be simulated on an event-driven gate-level logic simulator (not shown) or an instruction set simulator (not shown).

In one embodiment, emulator 16 may include special emulation hardware. In such an embodiment, emulator 16 may map a synthesized HDL design onto the special emulation hardware. Such emulation hardware may comprise many re-programmable FPGA devices and/or special purpose processors, and the emulation hardware may execute a model of the HDL design.

In various embodiments, emulator 16 may be a verification platform for simulating a system on chip. Emulator 16 may include a plurality of processors for executing simulation code in parallel. Emulator 16 may be used to run tests that simulate the functionality of a SoC, and emulator 16 may be utilized for running tests prior to the fabrication of a SoC. In one embodiment, emulator 16 may be a Palladium® series emulator from Cadence Design Systems®. In various embodiments, emulator 16 may simulate a synthesized netlist of the HDL design.

Emulator 16 may also be coupled to simulation computer 18. Simulation computer 18 may provide real-time access to the various values and states within simulation models running on emulator 16. The values of various registers, gates, and flip-flops within emulator 16 may be visible at all times through simulation computer 18.

In one embodiment, a snapshot 26 may be taken of SoC model 17 in emulator 16. The snapshot 26 may be extracted from emulator 16 via simulation computer 18. Simulation computer 18 may allow visibility into every flip-flop of SoC model 17 in emulator 16, and snapshot 26 may capture all of the values of the flip-flops within SoC model 17. In another embodiment, the snapshot 26 may capture values from a portion of the flip-flops within SoC model 17. After the snapshot 26 is taken, the snapshot 26 may be saved as a golden reference model in simulation computer 18. In another embodiment, the snapshot 26 may be stored in another location.

In addition to taking snapshot 26, a scan dump operation may also be performed. One or more input clocks for the design in emulator 16 may be stopped, and then a scan dump operation may be performed. The scan dump operation may involve scanning out all or a portion of the flip-flops. The scanned out values of the flip-flops may be conveyed from the emulator 16 to debugger 14 and then from debugger 14 to host computer 12. The scan dump values may then be stored on host computer 12 as scan dump bitstream 24. In another embodiment, the scan dump values may be stored in another location. Then, after scan dump bitstream 24 has been captured and saved, the scan dump bitstream 24 may be compared to snapshot 26 as shown in comparison block 28. If there is a match, the operation of the scan dump operation may be considered verified.

Host computer 12, simulation computer 18, and debugger 14 may include various hardware and software components. The hardware components may include one or more processors, memory devices, display devices, and input/output (I/O) devices, connected together via a bus architecture. The software components may include an operating system stored in a memory device. The operating system may be any of various types of operating systems, such as Apple® Mac OS or iOS, Linux®, Unix®, Solaris®, Microsoft Windows®, or others. It is noted that test and debug environment 10 may include other components and connections/interfaces not shown in FIG. 1.

Figure 2:
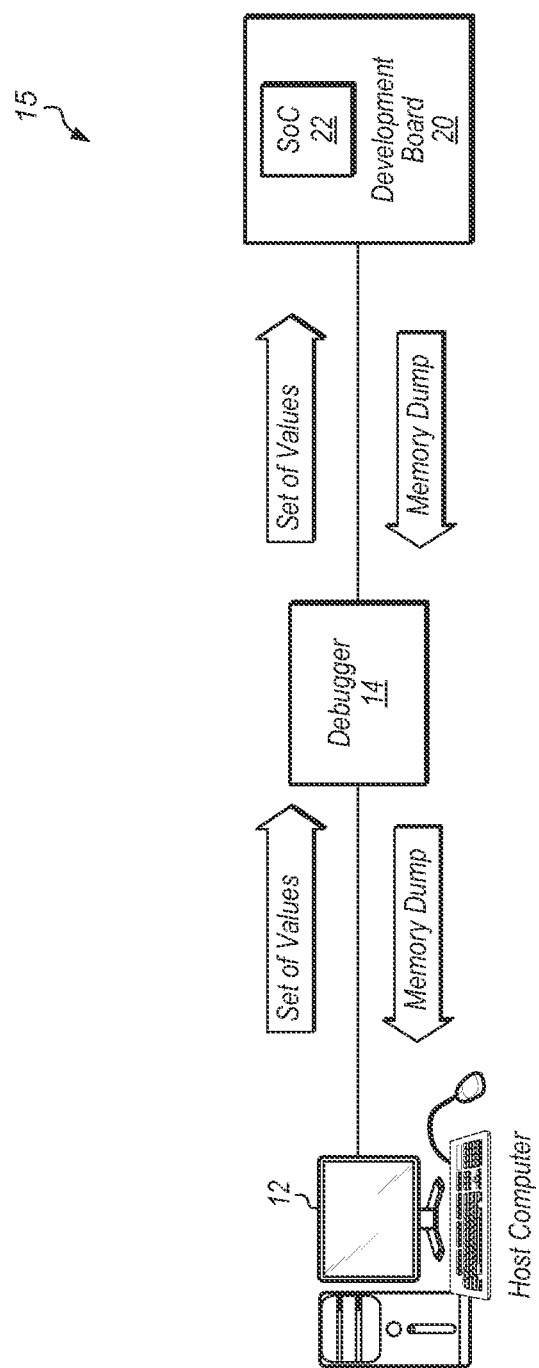
FIG. 2 is a block diagram illustrating another embodiment of a design verification system.

Turning now to FIG. 2, a block diagram of another embodiment of a design verification system 15 is shown. Design verification system 15 may include development board 20, which may be a printed circuit board in one embodiment. Development board 20 may include one or more fabricated chips, such as system on chip (SoC) 22. In the various tests and operations executed on development board 20, SoC 22 may be configured to operate as it would in its target environment and to run at its target speed.

It is noted that development board 20 may also include other components not shown in FIG. 2. These other components may include I/O connectors, I/O circuits, buffers, voltage regulators, power connectors, and/or various other components. In various embodiments, SoC 22 may also be referred to as an integrated circuit (IC) or as an application specific integrated circuit (ASIC). SoC 22 may be utilized in a variety of end products, such as cell phones, smartphones, tablets, electronic reading devices, computers, servers, televisions, video game consoles, and various other products.

In various embodiments, design verification system 15 may facilitate the development and testing of SoC modules that reside on development board 20. The same scripts and JSM files that were used during development of the models of the SoC in emulator 16 (of FIG. 1) may be reused after SoC 22 has been fabricated and assembled onto development board 20. Although not shown in FIG. 2, in various embodiments, development board 20 may also be connected to various pieces of test equipment (e.g., logic analyzer, spectrum analyzer, power meter) to monitor the operation of board 20.

In one embodiment, host computer 12 may transmit JSM commands to debugger 14, and debugger 14 may translate the JSM commands into JTAG commands, and then debugger 14 may convey the JTAG commands to SoC 22. Executing the JTAG commands may cause control signals and/or commands to be transmitted to development board 20. The JTAG commands may control the execution of tests and various functions of SoC 22 on development board 20.

SoC 22 may receive the JTAG commands transmitted by debugger 14, and in response, SoC 22 may perform one or more operations. While performing the one or more operations, SoC 22 may generate responses and transmit data back over the JTAG interface to debugger 14. In one embodiment, SoC 22 may include an on-chip TAP controller that changes states in response to received JTAG commands.

In one embodiment, debugger 14 may include a software debugger tool. The software debugger tool may allow a software developer to control the execution of a software program executing on SoC 22 by setting break-points, sequentially single-stepping through the execution of the program, and looking at the program's state by examining and displaying variables and expressions. Debugger 14 may include a communication interface for transmitting debugging commands to SoC 22 on development board 20.

In one embodiment, host computer 12 may verify the proper functioning of a memory dump operation running on SoC 22. The process for verifying this operation involves several steps. The first step involves writing a set of values to SoC 22. The second step involves performing a memory dump operation which will cause SoC 22 to write out the contents of one or more of its various memories. Then, the third step involves comparing the results of the memory dump operation to the set of values. If the results of the comparison match, then the proper functioning of the memory dump operation has been verified. Each of the steps of the verification of the memory dump operation is explained in further detail below.

The memory dump operation may begin by writing a set of values into one or more of the various memories of SoC 22. In one embodiment, the set of values may be randomly generated values, and the set of values may be stored for later use in the comparison step. In other embodiments, the set of values may be based on various other criteria. The amount of data written to the memories may vary from embodiment to embodiment, depending on the total amount of memory on SoC 22. Also, in some embodiments, a portion of the memories of SoC 22 may be tested with a memory dump operation, rather than the entire memory space of SoC 22.

A script may be executed to write this set of values to SoC 22. The script may be stored on host computer 12, entered on a TCL console command line, conveyed to debugger 14, and then converted to JTAG commands by a translator. Then, the corresponding JTAG commands may be conveyed to SoC 22 on development board 20. The JTAG commands received by SoC 22 may be used to fill the memories with the set of values.

After the set of values are written to the memories within SoC 22, then the second step may be implemented, which may involve executing a memory dump operation script to execute a plurality of JSM files. In one embodiment, one JSM file may be created for each type of memory within SoC 22. When a memory dump operation script is executed, each of the corresponding JSM files may be accessed to perform the operation. In one embodiment, the sequence in which the memory dump operation is performed may not be order dependent, and so the memory dump JSM files may be accessed in any order. The execution of the plurality of memory dump JSM files may be automated, such that the memory dump operation can be run automatically instead of manually executing each individual JSM file. For example, a memory dump operation script may be invoked and the script may call each of the relevant JSM files. The script may contain multiple JSM commands for reading and executing input files. The JSM commands may be converted to JTAG commands by a translator, and the JTAG commands may be conveyed to SoC 22, which may cause SoC 22 to execute the memory dump operation.

When SoC 22 performs a memory dump operation, the data values read out from each of the memories of SoC 22 may be transmitted from SoC 22 back to debugger 14. From debugger 14, the data values may be transmitted back to host computer 12, and then the data values may be compared with the original set of values. If the results of the comparison show a match between data values retrieved from the memory dump operation and the original set of values, then this will provide a verification of the proper functioning of the memory dump operation. The above described operations relating to the verification of the memory dump operation may also be performed in design verification system 10 (of FIG. 1) on a design or model within emulator 16.

In one embodiment, the data values read from the memories of SoC 22 may be post-processed to create a human-readable report. Instead of being displayed as a stream of bit values, the extracted memory data may be converted into a human-readable format. The human-readable format may show the memory location and values of specific memory addresses, and the human-readable format may structure the bitstream similar to the format of the actual memory. For example, the report may display addresses with the data values, show cache values, and provide other views of the memory that are easy for a software developer to read. The post-processing is based on the memory configuration of SoC 22 and the hierarchical path information of the locations of the various memories, the logical block names of the memories, and other relevant information. In other embodiments, the scan dump values may also be post-processed to convert the flip-flop values into a human-readable report. The human-readable report may provide the names, locations, and other information associated with the flip-flops.

In one embodiment, a preliminary verification of a scan dump operation may be performed on development board 20 based on values of a relatively small number of flip-flops whose values are known. For example, on SoC 22 within development board 20, the values of a first portion of the flip-flops may be constant or otherwise known. When a scan dump operation is performed on development board 20, received values of these flip-flops may be compared to expected values and used to provide a preliminary indication as to whether the scan dump operation is correct. If one or more of these flip flops has an unexpected (incorrect) value, this may serve as an early indication that there is a problem with the scan dump operation.

Figure 3:
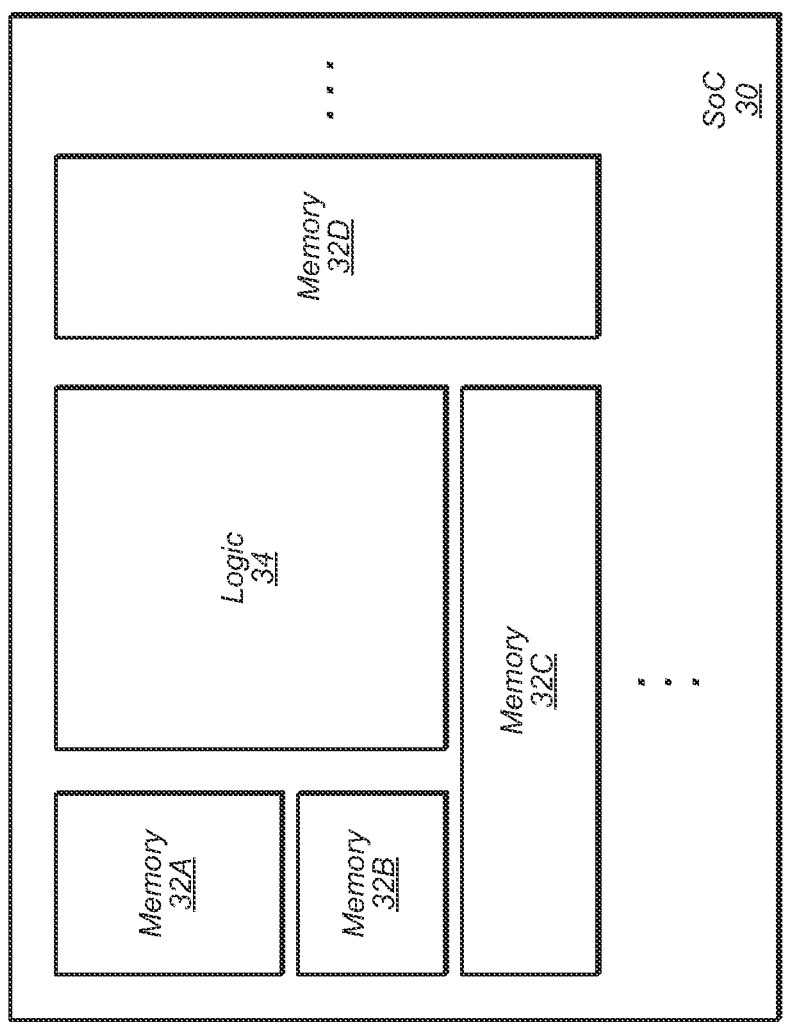
FIG. 3 is a block diagram that illustrates one embodiment of a SoC.

Turning now to FIG. 3, a block diagram of one embodiment of a SoC including various types of memories is shown. Memories 32A-D are representative of any number and type of memories included within SoC 30. For example, the lengths and other characteristics, such as the size and shape, may vary for each of the different types of memories. Memories 32A-D may also be dispersed throughout SoC 30 in various locations. Logic 34 is representative of other types of circuitry (e.g., processors, memory controllers, I/O devices) within SoC 30. Memories 32A-D may also include one or more caches.

In one embodiment, memories 32A-D located in SoC 30 may be defined in a specification. The memory specification may have a specific format, defining how many bits there are of each memory type, where the memory is located, and other related details. The specification may be parsed and used to create a plurality of JSM files, wherein each JSM file contains a plurality of commands for reading out the data from a specific range and particular type of memory of the overall SoC 30 memory space. For example, in one embodiment, the memory specification may be parsed to automatically generate JSM files and commands to perform memory dump operations for any number of different memory types.

Figure 4:
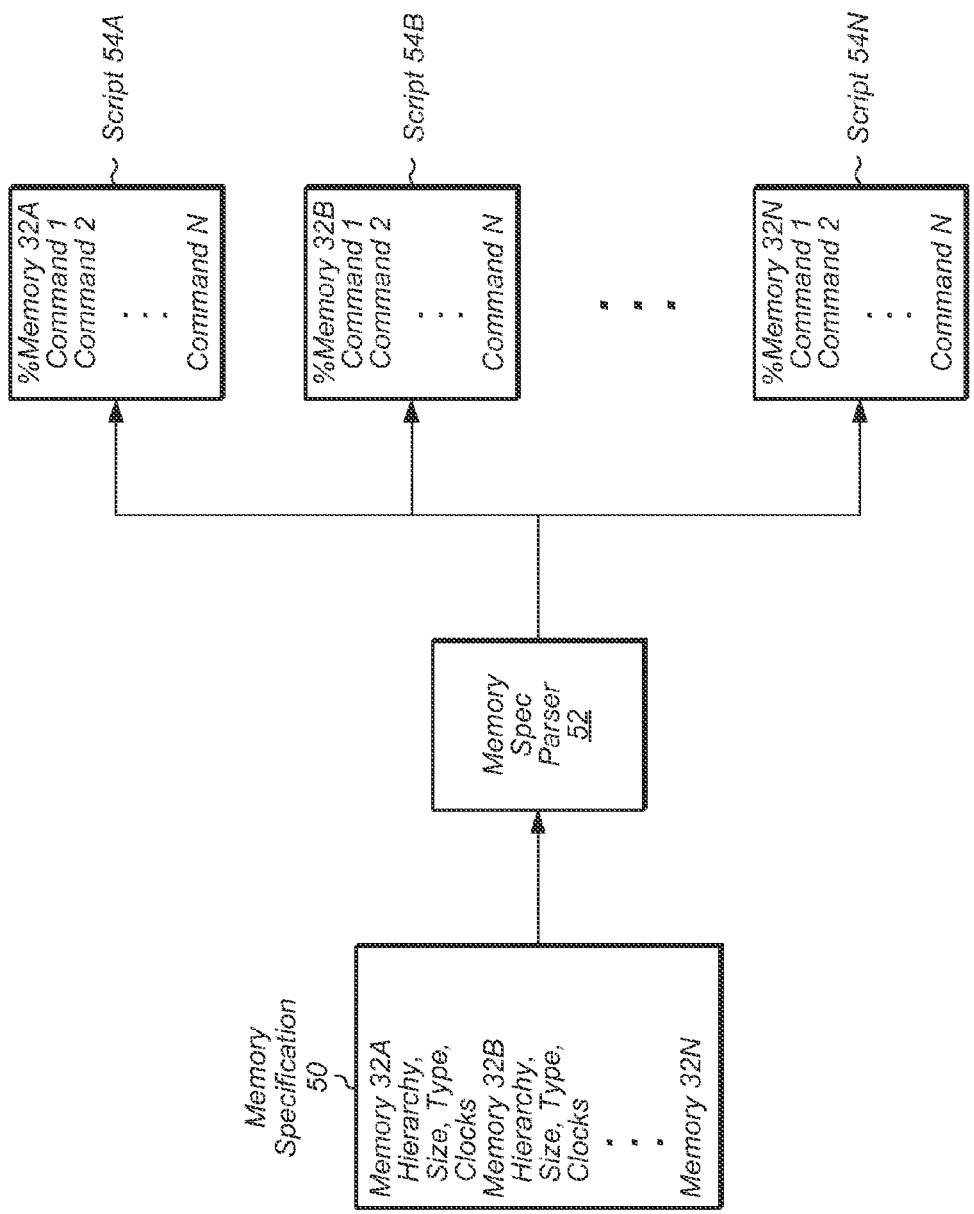
FIG. 4 is a block diagram of a parser processing a memory specification to generate multiple scripts.

Turning now to FIG. 4, a block diagram of a parser processing a memory specification to generate multiple scripts is shown. Memory specification 50 is representative of any of various types of memory specifications that may be provided for one or more memories that are located within a SoC, such as SoC 30 (of FIG. 3). As shown in FIG. 4, memory specification 50 may include configuration details on memories 32A-N, which are representative of any number of memories. Memory specification 50 may be provided by the manufacturer of the memories for the SoC.

Memory specification 50 may provide detailed information on the memories within a corresponding SoC. Memory specification 50 may include information such as the name, hierarchy, sizes (e.g., 256×32, 64×64), memory type, clocks, and other information for each memory within the SoC. Memory specification 50 may also provide memory built-in self-test (MBIST) grouping, numbers of MBIST controllers, and other information. In one embodiment, memory specification 50 may be referred to as a MBIST specification.

Parser 52 may receive memory specification 50, and then parser 52 may analyze and parse memory specification 50 to generate one or more scripts for performing memory operations. In one embodiment, parser 52 may generate one or more scripts for performing a memory dump operation. Parser 52 may extract MBIST grouping information from memory specification 50, and parser 52 may also read in top-level control information from other setup files. Parser 52 may be written in any of various scripting or programming languages. For example, in one embodiment, parser 52 may be a PERL script. In various embodiments, parser 52 may be configured to run on a host computer, on a debugger, or on any of various other devices.

Each of scripts 54A-N may include a plurality of commands written in a first language. In one embodiment, the first language may be JSM. In another embodiment, scripts 54A-N may be written in another language. The commands may be translated to a second language to be executed by a DUT when performing an operation (e.g., memory dump operation). In one embodiment, the second language may be compliant with the JTAG protocol.

In one embodiment, scripts 54A-N may be utilized for memory operations on a SoC. In another embodiment, scripts 54A-N may be utilized for memory operations on a SoC model in an emulator. In one embodiment, scripts 54A-N may be utilized to perform and/or verify a memory dump operation. For example, a memory dump operation verification script may make calls to one or more scripts 54A-N to write data to the respective one or more memories. Then, after the data has been written to one or more memories, a memory dump operation script may be executed to perform a memory dump operation, and the output of the memory dump operation may be compared to the data written to the one or more memories. The memory dump operation script may make calls to one or more scripts 54A-N to perform the memory dump operation. In some embodiments, there may be separately generated scripts for each memory. For example, a first generated script may be utilized to write data to a given memory, and a second generated script may be utilized to perform a memory dump operation of the given memory.

Referring now to FIG. 5, one embodiment of a script file for performing a memory dump operation is shown. Script 54A may be generated from a memory specification file by a parser. In one embodiment, script 54A may be generated from one or more memory specification files similar to that of file 50 (of FIG. 4) by parser 52 (of FIG. 4). Script 54A is written in the JSM language. In other embodiments, script 54A may be written in other languages.

The various "SHIR" commands may be utilized to load the argument specified after the "SHIR" command into the instruction register of a TAP controller of the target DUT. The various "SHDR" commands may load data into the data register of the TAP controller of the DUT. The data may be specified by a length parameter in the first argument and the data parameter in the second argument. For example, the command "SHDR 61 0x00000000 0x00010000" may load 61 bits of the hexadecimal data "0x00000000 0x00010000" into the TAP controller data register of the DUT. The various "MSIR" commands may load the first argument specified after the command into the instruction register of the TAP controller. The "MSIR" commands may load the second argument specified after the command into the instruction register of the built-in self-test (BIST) TAP controller. The "==" lines of script 54A are comments. A portion of script 54A is shown in FIG. 5, and script 54A may contain similar code for other addresses of the memory partitions on which the memory dump operation is being performed.

Figure 6:
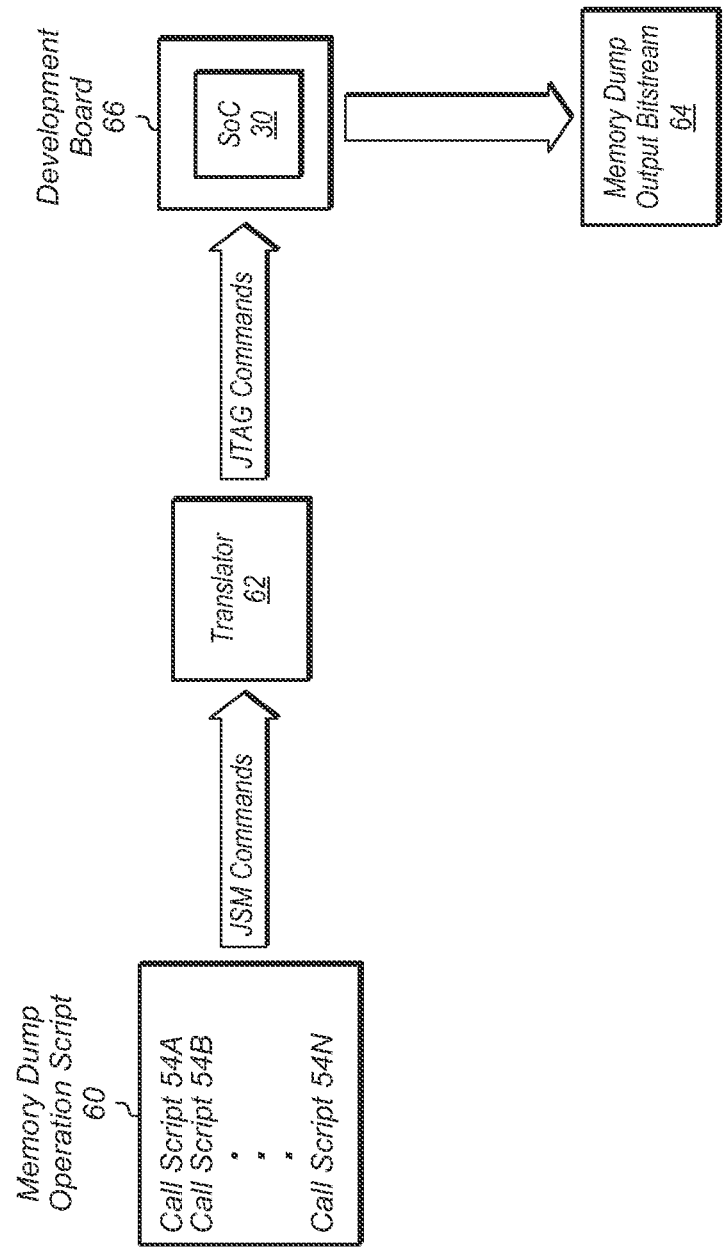
FIG. 6 is a block diagram of one embodiment of a memory dump operation.

Turning now to FIG. 6, a block diagram of one embodiment of a memory dump operation is shown. Memory dump operation script 60 may be a top-level script which may be utilized to call a plurality of individual script files corresponding to individual memories of a DUT. For example, script 60 may be invoked to perform a memory dump operation of SoC 30. As shown in FIG. 6, script 60 may call scripts 54A-N, which are configured to perform memory dump operations on memories 32A-N (of FIG. 3) of SoC 30. Each of scripts 54A-N may contain one or more commands written in the JSM language.

The JSM commands of scripts 54A-N may be conveyed to translator 62. In one embodiment, translator 62 may be a software application running on a debugger. Translator 62 may translate the JSM commands into JTAG commands and then convey the JTAG commands to SoC 30 on development board 66. The JTAG commands may be executed by SoC 30 to perform a memory dump operation of a plurality of memories contained within SoC 30. Memory dump output bitstream 64 may be generated by the memory dump operation, and bitstream 64 may be post-processed and/or stored for further use.

Referring now to FIG. 7, a scan dump operation script in accordance with one or more embodiments is shown. Scan dump operation script 70 includes a plurality of JSM commands. In the example shown in FIG. 7, scan dump operation script 70 may be utilized to perform a scan dump operation for at least one partition of a DUT. In one embodiment, a scan dump operation may be performed for a single partition of a DUT. In another embodiment, a scan dump operation may be performed for an entire DUT.

Each of the JSM commands in script 70 may be translated to one or more JTAG commands by a translator application. In various embodiments, the JTAG commands may be sent to a TAP controller of the DUT. In one embodiment, the DUT may be a SoC model in an emulator. In another embodiment, the DUT may be a SoC on a development board. In a further embodiment, the DUT may be any of various other devices or software models.

In script 70, the "INIT" command may initialize the DUT. The "SHIR STOP_CLK" command may load a stop clock instruction into the instruction register of the TAP controller of the DUT. The "WAIT" command may wait for a user to enter a command on a host computer. The "SHIR SEL_PARTITION" command may load a select partition instruction into the instruction register. In one embodiment, when "SEL_PARTITION" is loaded into the instruction register, a partition selection register may be connected between test data input (TDI) and test data output (TDO). This register may select the partition to test. In another embodiment, an instruction may be loaded into the partition selection register to select all of the partitions. The various "SHDR" commands may shift the data in the second argument into the data register of the TAP controller of the DUT, and the data may have the length specified in the first argument. The data in the "SHDR" commands may be utilized to identify a specific partition.

The "SHIR J1500I" command may load instruction J1500I into the instruction register. This instruction may enable data to be loaded into one or more registers associated with the selected partition. The "SHIR SCAN_DUMP" may load the scan dump instruction into the instruction register and initiate a scan dump operation. The "SHDM" command may shift a pattern of bits, based on the second argument, into a data register. The length of the pattern may be determined by the first argument following the "SHDM" command. In other embodiments, script 70 may include one or more other commands and/or may omit one or more of the commands shown in FIG. 7.

Figure 8:
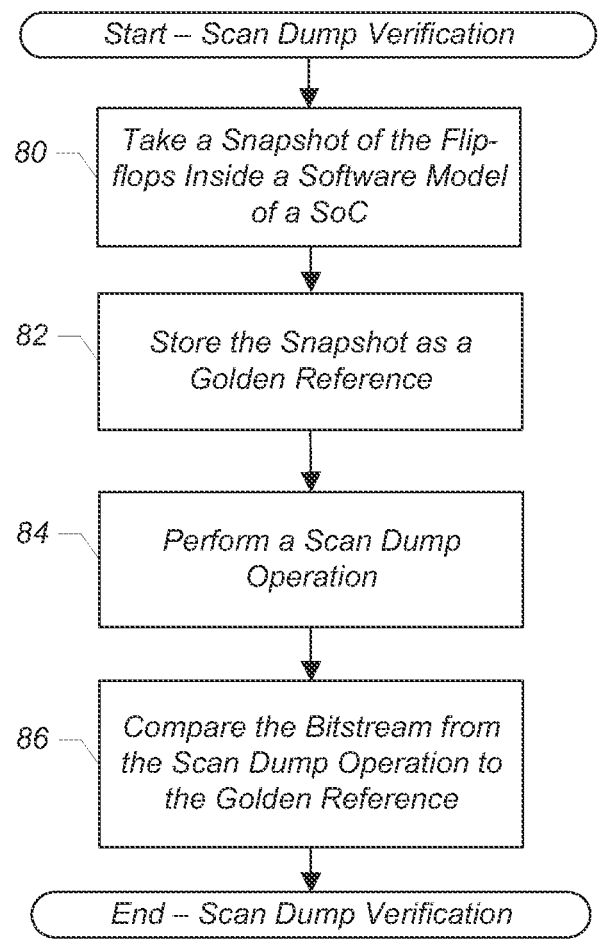
FIG. 8 is a generalized flow diagram illustrating one embodiment of a method for verifying a scan dump operation.

Referring now to FIG. 8, one embodiment of a method for verifying a scan dump operation is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A snapshot may be taken of the flip-flops inside a software model of a SoC (block 80). The software model may be a design captured in a HDL, and the design may be compiled and synthesized to run in the emulator. The snapshot may be taken by a simulation computer coupled to the emulator. In one embodiment, the snapshot may include the values of all of the flip-flops inside the software model. In another embodiment, the snapshot may include the values of a portion of the flip-flops inside the software model.

The snapshot may be stored as a golden reference (block 82). In one embodiment, the snapshot may be stored as a golden reference by the simulation computer. Then, a scan dump operation may be performed (block 84). Performing the scan dump operation may include scanning out a bitstream of values from the plurality of flip-flops of the model and then conveying the bitstream from the emulator to a debugger. Then, the bitstream may be conveyed from the debug controller to a host computer. The bitstream from the scan dump operation may be compared to the golden reference (block 86). If the bitstream matches the golden reference, then this verifies the accuracy of the scan dump operation.

Figure 9:
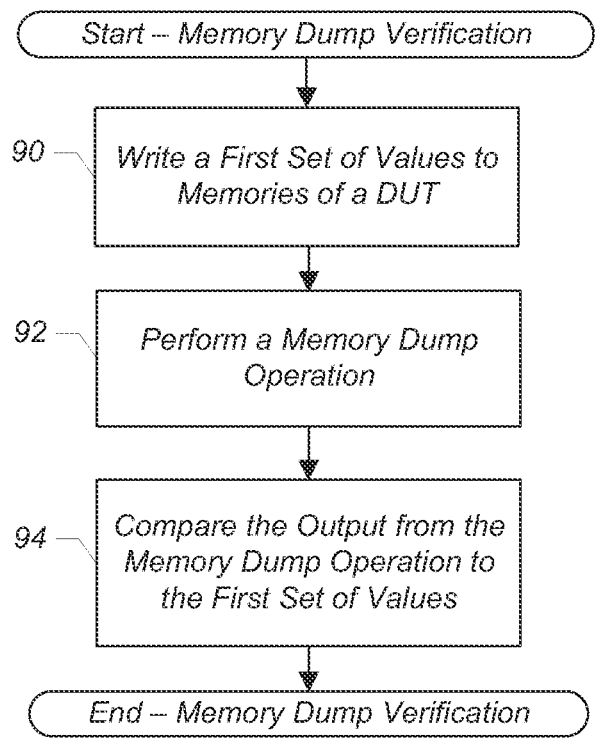
FIG. 9 is a generalized flow diagram illustrating one embodiment of a method for verifying a memory dump operation.

Referring now to FIG. 9, one embodiment of a method for verifying a memory dump operation is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A set of values may be written to the plurality of memories within a DUT (block 90). Next, a memory dump operation may be performed (block 92). The memory dump operation may be performed by executing one or more scripts generated by parsing a memory specification. In one embodiment, the memory dump operation may not be order dependent in regard to the order in which each memory in the DUT is read. Therefore, in this embodiment, the memories of the DUT may be read in any order when performing the memory dump operation. Then, the output of the memory dump operation may be compared to the set of values (block 94). If the output from the memory dump operation matches the set of values, then this verifies the proper functioning of the memory dump operation. In one embodiment, the DUT may be a SoC model in an emulator. In another embodiment, the DUT may be a SoC on a development board. In other embodiments, the DUT may be any of various other models or devices on a variety of platforms.

Figure 10:
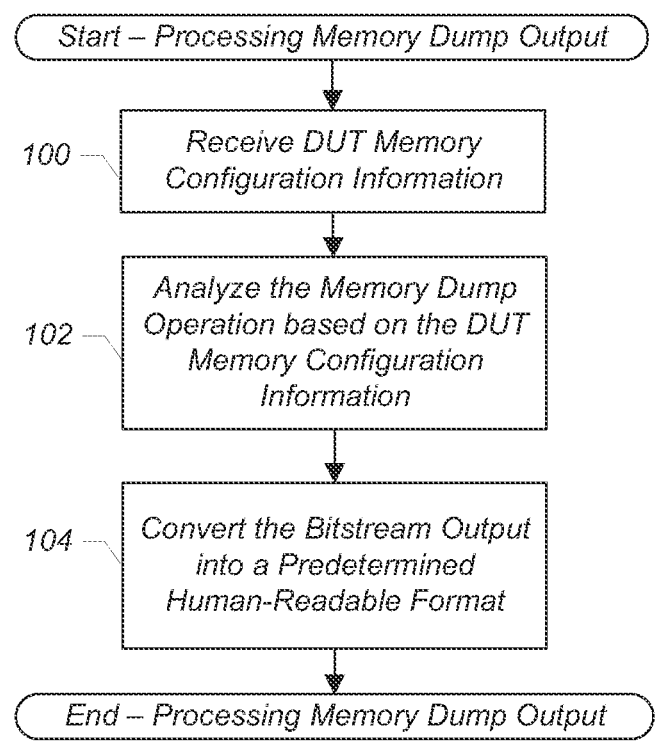
FIG. 10 is a generalized flow diagram illustrating one embodiment of a method for processing a memory dump operation output.

Referring now to FIG. 10, one embodiment of a method for processing the output of a memory dump operation is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

The memory configuration of the DUT may be received (block 100). In one embodiment, the memory configuration of the DUT may be received by the host computer. The memory configuration may include names, hierarchical information, addresses, sizes, types, and other information about the various memories of the DUT. The bitstream output of the memory dump operation may be analyzed based on the DUT memory configuration information (block 102). Then, the bitstream output of the memory dump operation may be converted into a predetermined human-readable format (block 104). Information may be extracted from the memory dump operation based upon knowledge of the memory space of the DUT. In one embodiment, the memory dump operation may be parsed for the pertinent data. The data may be manipulated in any desired fashion to create a human-readable report so that the memory can be viewed at a top level, at or within each level of the memory hierarchy, or down to a single memory address.

Figure 11:
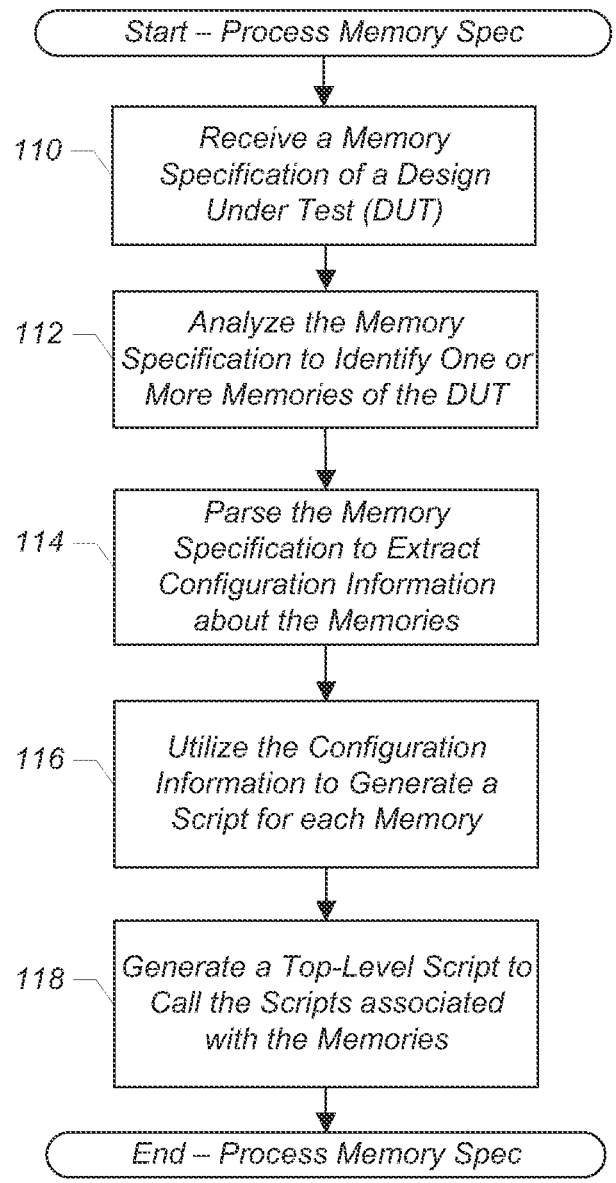
FIG. 11 is a generalized flow diagram illustrating one embodiment of a method for processing a memory specification.

Referring now to FIG. 11, one embodiment of a method for processing a memory specification is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A memory specification of a design under test (DUT) may be received by a program executing on a host computer (block 110). The memory specification may include configuration information on the one or more memories of the DUT. In one embodiment, the memory specification may be received by a host computer, and the program executing on the host computer may be a memory parsing program. In one embodiment, the memory parsing program may be written in a scripting language (e.g., PERL). In another embodiment, any of other types of programs written in any of various other languages may receive the memory specification. In one embodiment, the DUT may be a software model running in an emulator. In another embodiment, the DUT may be a SoC on a development board.

The memory specification may be analyzed by the program to identify one or more memories of the DUT (block 112). Then, the memory specification may be parsed to extract configuration information of the one or more memories (block 114). The configuration information may include names, hierarchies, sizes, memory types, MBIST groups, and MBIST controllers for each of the memories of the DUT. The configuration information may be utilized to generate a script for each identified memory (block 116). Then, a top-level script may be generated to call each of the scripts associated with the identified memories (block 118). The top-level script may be invoked to perform a memory dump operation. When the top-level script is invoked, each of the scripts corresponding to the memories of the DUT may be executed.

Figure 12:
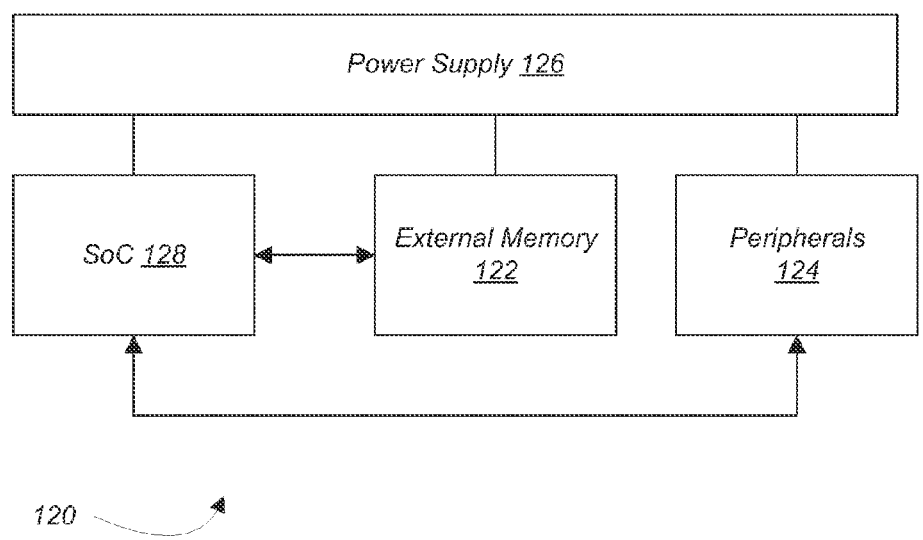
FIG. 12 is a block diagram illustrating one embodiment of a system including a SoC.

Turning now to FIG. 12, a block diagram of one embodiment of a system 120 is shown. In the illustrated embodiment, the system 120 includes at least one instance of a SoC 128 coupled to external memory 122. In one embodiment, SoC 128 may be a previously described SoC, such as SoC 22. In various embodiments, SoC 128 may be fabricated based upon a model of a SoC. SoC 128 is coupled to one or more peripherals 124 and the external memory 122. A power supply 126 is also provided which supplies the supply voltages as well as one or more supply voltages to the integrated circuit 10, memory 122, and/or the peripherals 124. In other embodiments, more than one power supply 126 may be provided. In some embodiments, more than one instance of SoC 128 may be included (and more than one external memory 122 may be included as well).

The peripherals 124 may include any desired circuitry, depending on the type of system 120. For example, in one embodiment, the system 120 may be a mobile device (e.g., personal digital assistant (PDA), smart phone, electronic reading device) and the peripherals 124 may include devices for various types of wireless communication, such as Wi-Fi, Bluetooth, cellular, global positioning system, etc. The peripherals 124 may also include additional storage, including RAM storage, solid state storage, or disk storage. The peripherals 124 may include user interface devices such as a display screen, including touch display screens or multitouch display screens, keyboard or other input devices, microphones, speakers, etc. In other embodiments, the system 120 may be any type of computing system (e.g., desktop personal computer, laptop, workstation, video game console, nettop).

The design verification techniques disclosed herein can be implemented in a variety of ways including, as a system, device, method, and a computer readable medium. It is noted that the illustrated systems may comprise various forms and types of software. In one embodiment, program instructions and/or a database that represent the described systems, components, and/or methods may be stored on a computer readable storage medium. Generally speaking, a computer readable storage medium may include any non-transitory storage media accessible by a computer during use to provide instructions and/or data to the computer. For example, a computer readable storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM)), ROM, non-volatile memory (e.g. Flash memory) accessible via a peripheral interface such as the USB interface, etc. Storage media may include micro-electro-mechanical systems (MEMS), as well as storage media accessible via a communication medium such as a network and/or a wireless link.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A method comprising:
    receiving a memory specification corresponding to a design under test (DUT), wherein the memory specification comprises configuration information on one or more memories of the DUT;
    analyzing the memory specification to identify one or more memories;
    parsing the memory specification to extract configuration information associated with the one or more identified memories;
    for each identified memory, utilizing the configuration information to generate a respective script comprising a plurality of commands, wherein the plurality of commands of each respective script are written in a first language, and wherein the plurality of commands are configured to perform a memory dump operation of the identified memory;
    generating a top-level script with one or more commands to call one or more respective scripts corresponding to the one or more identified memories, wherein the top-level script is configured to perform a memory dump operation of the one or more identified memories.

2. The method as recited in claim 1, further comprising utilizing the top-level script to perform a memory dump operation.

3. The memory as recited in claim 2, wherein performing the memory dump operation comprises:
    invoking the top-level script on a command line prompt to execute one or more scripts corresponding to one or more identified memories;
    translating the one or more commands of each of the one or more scripts from the first language to one or more commands in a second language; and
    conveying the one or more commands in the second language to the DUT.

4. The method as recited in claim 3, wherein the second language is compliant with joint test action group (JTAG) protocol.

5. The method as recited in claim 3, further comprising verifying the accuracy of the memory dump operation.

6. The method as recited in claim 5, wherein prior to performing the memory dump operation, the method comprising writing a set of values to the one or more identified memories, and wherein verifying the accuracy of the memory dump operation comprises comparing an output bitstream of the memory dump operation to the set of values.

7. The method as recited in claim 1, wherein the configuration information associated with each of the one or more identified memories comprises a name, a hierarchy, a size, a memory type, a memory built-in self-test (MBIST) group, and a MBIST controller.

8. The method as recited in claim 1, wherein the DUT is a software model running in an emulator.

9. The method as recited in claim 1, wherein the DUT is a system on chip (SoC) on a development board.

10. A computer readable storage medium comprising program instructions, wherein when executed the program instructions are operable to:
- receive a memory specification of a design under test (DUT), wherein the memory specification comprises configuration information on one or more memories of the DUT;
- analyze the memory specification to identify one or more memories;
- for each identified memory, parse the memory specification to generate a respective script comprising a plurality of commands, wherein the plurality of commands are configured to perform a memory dump operation of the identified memory;
- generate a top-level script to perform a memory dump operation of a plurality of identified memories.

11. The computer readable storage medium as recited in claim 10, wherein when executed the program instructions are further operable to receive top-level control information from one or more setup files.

12. The computer readable storage medium as recited in claim 10, wherein when executed the program instructions are further operable to extract memory built-in self-test (MBIST) grouping information from the memory specification.

13. The computer readable storage medium as recited in claim 10, wherein when executed the program instructions are further operable to:
- utilize the top-level script to perform a memory dump operation;
- receive an output bitstream from the memory dump operation; and
- process the output bitstream to generate a human-readable report of the memory dump operation.

14. A method for use in a computing environment, the method comprising:
- taking a snapshot of one or more flip-flops inside a software model of a system on chip (SoC);
- storing the snapshot as a golden reference;
- performing a scan dump operation; and
- comparing a bitstream of values from the scan dump operation to the golden reference.

15. The method as recited in claim 14, wherein a simulation computer is configured to take the snapshot of the one or more flip-flops inside the software model of the SoC.

16. The method as recited in claim 14, wherein performing the scan dump operation comprises:
- scanning out a bitstream of values from the one or more flip-flops;
- conveying the bitstream of values from the software model of the SoC to a debugger; and
- conveying the bitstream of values from the debugger to a host computer.

17. The method as recited in claim 14, wherein prior to performing the scan dump operation, the method comprising:
- invoking one or more commands to initiate a scan dump operation, wherein the one or more commands are in a first language;
- translating the one or more commands in the first language into one or more commands in a second language; and
- conveying the one or more commands in the second language to the software model of the SoC.

18. A system comprising:
- an emulator, wherein the emulator comprises a model of a system on chip (SoC);
- a debugger coupled to the emulator;
- a host computer coupled to the debugger; and
- a simulation computer coupled to the emulator;
- wherein the simulation computer is configured to:
  - take a snapshot of a plurality of flip-flops inside the model of the SoC; and
  - store the snapshot as a golden reference;
- wherein the host computer is configured to:
  - initiate a scan dump operation;
  - capture an output bitstream from the scan dump operation, wherein the output bitstream comprises values from the plurality of flip-flops inside the model of the SoC; and
  - compare the output bitstream to the golden reference.

19. The system as recited in claim 18, wherein initiating a scan dump operation comprises invoking a script on a command line console.

20. The system as recited in claim 18, wherein the script comprises one or more commands in a first language, and wherein in response to the host computer invoking the script on the command line console, the debugger is configured to:
- translate the one or more commands in the first language to one or more commands in a second language; and
- convey the one or more commands in the second language to the model of the SoC.

21. The system as recited in claim 18, wherein the output bitstream comprises values from the plurality of flip-flops of a single partition of the model of the SoC.

* * * * *